United States Patent [19]

Hikawa

[11] Patent Number: 4,672,329

[45] Date of Patent: Jun. 9, 1987

[54] CLOCK GENERATOR FOR DIGITAL DEMODULATORS

[75] Inventor: Kazuo Hikawa, Tokyo, Japan

[73] Assignee: Victor Company of Japan, Ltd., Yokohama, Japan

[21] Appl. No.: 861,437

[22] Filed: May 9, 1986

Related U.S. Application Data

[63] Continuation-in-part of Ser. No. 717,094, Mar. 28, 1985.

[30] Foreign Application Priority Data

Mar. 30, 1984 [JP] Japan .................................. 59-62849
May 11, 1985 [JP] Japan .................................. 60-99900

[51] Int. Cl.⁴ ............................................. H03L 7/00
[52] U.S. Cl. ..................................... 331/1 A; 331/11; 331/25; 307/526; 328/133
[58] Field of Search ......................... 331/1 A, 11, 25; 328/133, 134; 307/510, 525, 526, 527, 528; 329/122; 375/97

[56] References Cited

U.S. PATENT DOCUMENTS

4,617,526 10/1986 Hikawa ............................. 331/25 X

Primary Examiner—Eugene R. LaRoche
Assistant Examiner—Robert J. Pascal
Attorney, Agent, or Firm—Cushman, Darby & Cushman

[57] ABSTRACT

A clock generator for digital demodulators includes a voltage-controlled oscillator for generating clock pulses at controlled frequency and phase in response to error signals from phase and frequency comparators. The frequency comparator counts the clock pulse at longer periodic intervals to generate a first count representing a long-term measurement of the instantaneous clock frequency and further counts it at shorter periodic intervals to generate a second count representing a short-term measurement of the instantaneous clock frequency. The first count is compared with the limits of a narrow range to generate a first frequency control signal and the second count is compared with the limits of a wider range to produce a second frequency control signal. When the clock frequency goes out of the wide range, the short-term clock frequency detection causes the second frequency control signal to be generated quickly at a point in time earlier than the time the first frequency control signal is generated by the long-term clock frequency detection, so that the clock frequency is pulled into the wide range quickly for subsequent pull-in action by the long-term clock frequency detection into the narrow range.

13 Claims, 12 Drawing Figures

FREQUENCY →

CLOCK GENERATOR FOR DIGITAL DEMODULATORS

RELATED APPLICATION

This application is a Continuation-In-Part Application of Co-pending U.S. Pat. application Ser. No. 717,094, filed Mar. 28, 1985 by Hikawa et al, and assigned to the same assignee as the present invention.

BACKGROUND OF THE INVENTION

The present invention relates to a clock generator which derives clock information from a digital bit stream for a digital demodulator.

According to known digital modulation techniques, such as eight-to-foufteen modulation (EFM), original eight bit codes of random clock spacings are converted to fourteen bit codes of the format having a minimum spacing of three clock pulses and a maximum spacing of eleven clock pulses to provide enough clock information to demodulate the EFM bit stream.

Conventional clock generators employed for demodulating such EFM bit streams include circuitry that detects a series of data bits having the minimum and maximum clock spacings and counts clock pulses generated by a voltage-controlled oscillator which are present during the minimum and maximum spacings of the detected data bits. Two count values are derived as a measure of the frequency of the clock pulse to control the frequency of the oscillator. One disadvantage of the prior art is that since the data bits of minimum and maximum clock spacings occur at random the phase-locked loop is likely to remain out-of-phase with the input bit stream for a substantial period if successive frames contain no data bits having mininum and maximum clock spacings. The aforesaid Co-pending application eliminates the problem by a closed loop phase and frequency control circuit that includes a voltage-controlled oscillator for generating clock pulses and a pulse generator for generating a window pulse in response to an input binary digit and supplies it to a phase comparator for comparison with the clock pulse. A frequency comparator is provided to detect whether the frequency of the clock pulse is below the lower limit of a predetermined range or above the upper limit of that range and produces a frequency control signal of different amplitudes depending on the relative value of the clock frequency to the lower and upper limits. The frequency control signal is combined with the output of the phase comparator and applied to the voltage-controlled oscillator.

However, it is desired to minimize disturbance which occurs in clock frequency if the input data bit stream is interrupted for a substantial period of time as in the case of a helical scan tape recorder wherein the tape is wound on a 90° arc of a rotary drum and if the rate of the bit stream is varied abruptly as in the case of a digital tape recorder changing its tape transport speed.

SUMMARY OF THE INVENTION

It is therefore an object of the present invention to provide a closed-loop clock generator for use in digital demodulators which miminizes clock frequency disturbance which occurs as a result of a bit stream interruption or varying bit stream rate.

This object is obtained by providing narrow and wide capture ranges for closed loop frequency control, selecting the narrow capture range when the input bit stream is substantially continuous and selecting the wide capture range when the bit stream is of a discontinuous nature or the rate of bit stream is varied.

More specifically, the clock generator of the invention comprises a voltage-controlled oscillator for generating clock pulses having a frequency and a phase which are variable in response to phase and frequency control signals applied thereto. A window pulse generator is responsive to an input bit stream to a window pulse in response to a predetermined transition between binary "1"s and binary "0"s in the bit stream. A phase comparator provides phase comparison between the window and clock pulses for generating a phase control signal. A first frequency detector counts the clock pulse at longer periodic intervals to generate a first count representing a long-term measurement of the instantaneous frequency of the clock pulse and a second frequency detector counts the clock pulse at shorter periodic intervals to generate a second count representing a short-term measurement of the instantaneous frequency of the clock pulse. A comparator circuit detects whether the first count is below the lower limit of a narrow capture range or above the upper limit of this range and produces a first frequency control signal having different amplitudes depending on whether the first count is below or above the narrow range limits and detects whether the second count is below the lower limit of a wide range or above the upper limit of the wide range and produces a second frequency control signal having different amplitudes depending on whether the second count is below or above the wide range limits. Each one of the first and second control signals is combined with the phase control signal. The combined signals are applied to the voltage-controlled oscillator to control its phase and frequency. Because of the short-term measurement of the clock frequency, the deviation of clock frequency out of the wide range is detected earlier than the time at which the deviation of clock frequency out of the narrow range is detected by the long-term measurement. As a result, such large deviations which are likely to be caused by a dropout or a reception of discontinuous bit streams can be quickly restored to within the wide capture range. After the clock frequency is pulled back to the wide capture range, the long-term measurement plays a dominant factor to pull the clock frequency into the narrow capture range. A selector is preferably provided for disabling the narrow range frequency control when the bit stream occurs at a frequency higher than the normal frequency as during high-speed search mode.

BRIEF DESCRIPTION OF THE DRAWINGS

The present invention will be described in further detail with reference to the accompanying drawings, in which.

DETAILED DESCRIPTION

Figure 1A:
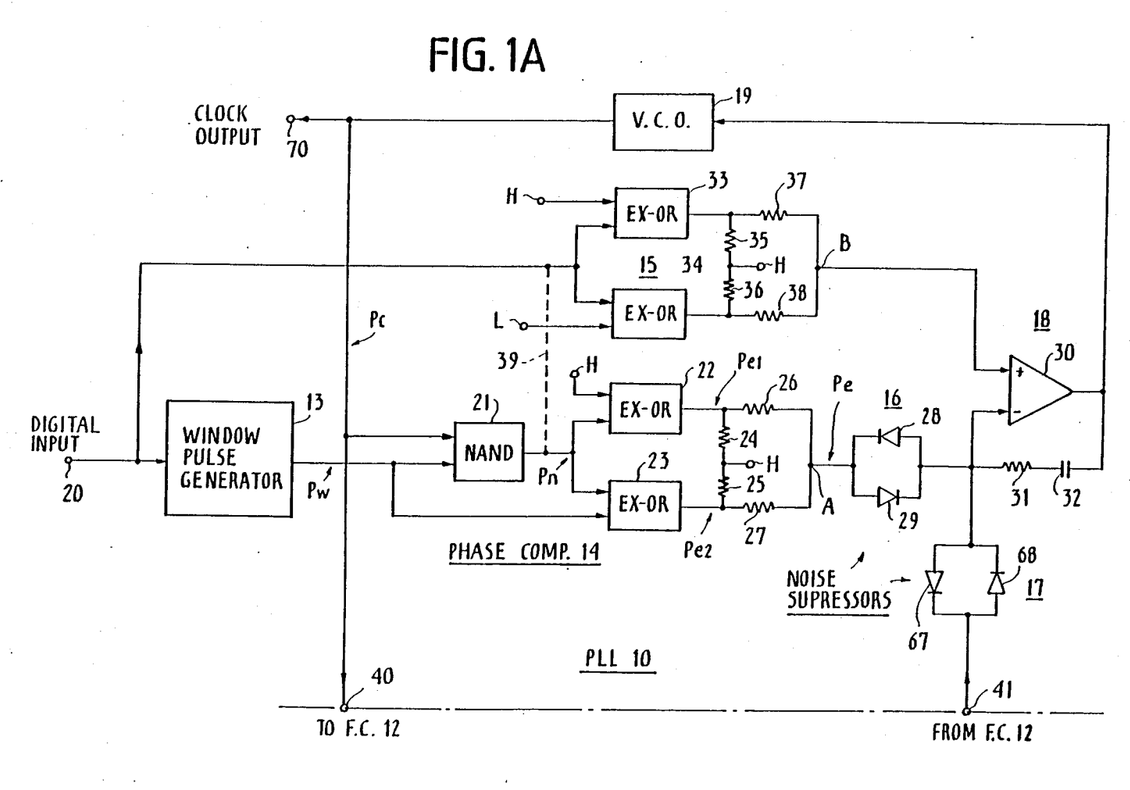
FIG. 1A is a block diagram of a phase-locked loop of the invention.
Figure 1B:
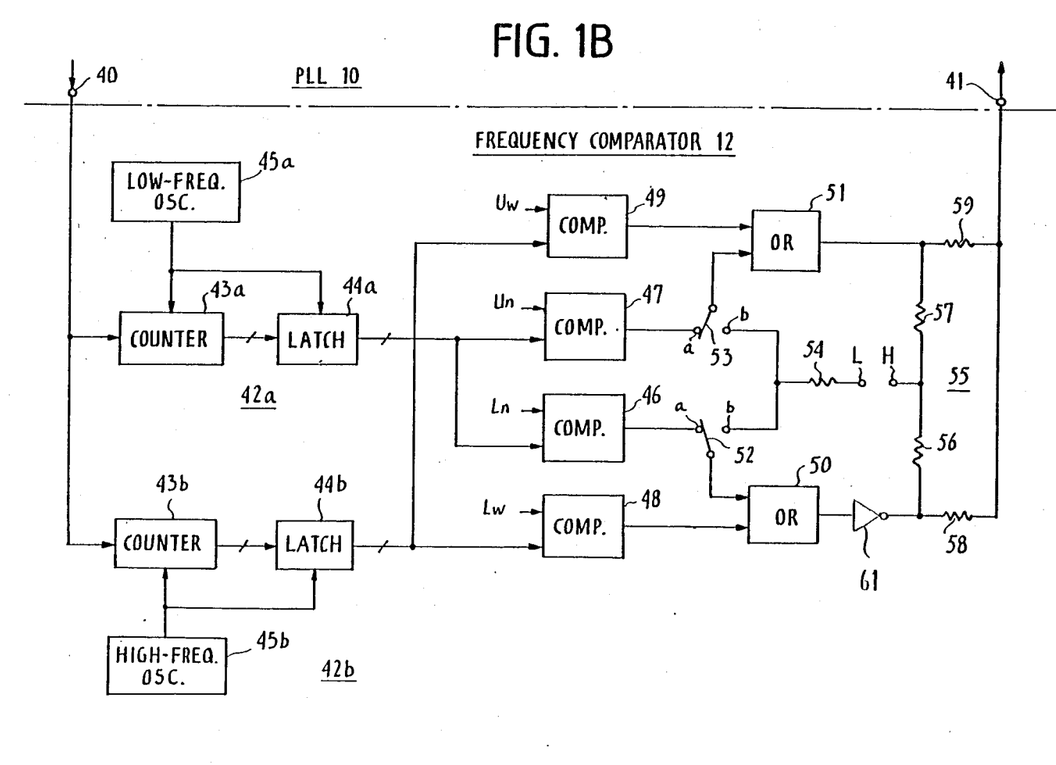
FIG. 1B is a block diagram of a frequency comparator constructed according to the invention.

In FIGS. 1A and 1B, there is shown a preferred embodiment of the clock generator of the present invention. The clock generator comprises a phase-locked loop 10 shown in FIG. 1A and a frequency comparator 12 shown separately in FIG. 1B. Phase-locked loop 10 includes a window pulse generator 13, a phase comparator 14, a phase reference circuit 15, noise suppressors 16, 17, a differential integrator 18 and a voltage-controlled oscillator 19. Window pulse generator 13 is connected to an input terminal 20 to which a digitally modulated bit stream is applied.

According to one digital modulation technique, original 16 bit code is divided into upper and lower binary significant groups of eight bits each and each group is converted to a 14-bit code in which binary "1"s occur at calculated maximum intervals to make it less likely to lose clock timing on playback. The EFM modulated bit stream is formatted into a series of data blocks, or frames of 588 bits, each identified by a 24-bit frame sync code which is followed by a data bit stream in which binary "1"s occur at a minimum spacing of 3 clock intervals and at a maximum spacing of 11 clock intervals. Binary "1"s and binary "0"s in the input bit stream present high and low voltages, respectively, at the input terminal 20.

Figure 2:
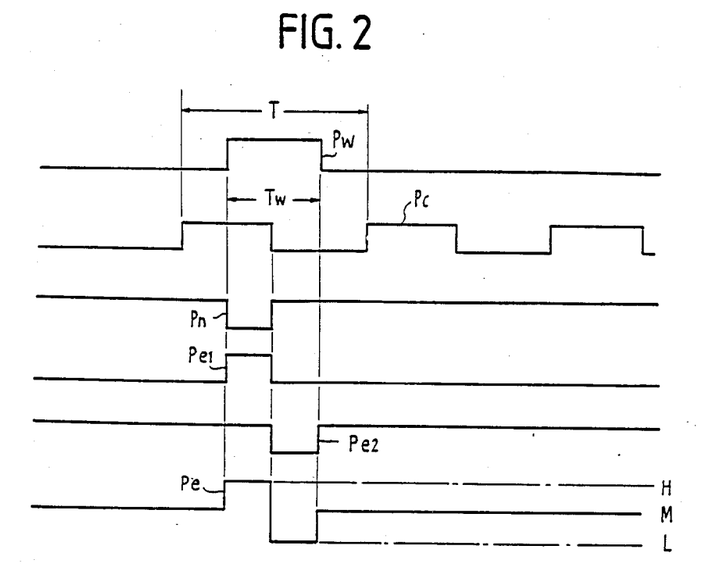
FIG. 2 is a waveform diagram useful for describing the operation of the phase-locked loop.

Window pulse generator 13 is responsive to the transition of binary level that occurs at the rising edge and/or falling edge of the positive-going pulses of the input bit stream and generates a window pulse Pw of a duration Tw smaller than the pulse spacing T of clock pulses Pc generated by the voltage controlled oscillator 19. The waveforms of these pulses are shown at FIG. 2. Preferably, the window and clock pulses have equal pulse duration.

Phase comparator 14 comprises a NAND gate 21, Exclusive-OR gates 22 and 23, and a resistor network formed by a first series of resistors 24, 25 and a second series of resistors 26, 27 both connected across the outputs of Exclusive-OR gates 22 and 23. One input of each Exclusive-OR gate is connected to the output of NAND gate 21 and the other input of Exclusive-OR gate 22 is connected to logical high level source. The other input of gate 23 is connected to the output of window pulse generator 13. A junction between resistors 24 and 25 is connected to a voltage source having a logical high level corresponding to binary "1" and a junction A between resistors 26 and 27 is connected through noise suppressor 16 to the inverting input of an operational amplifier 30. Resistors 26 and 27 form an analog adder circuit by which the voltages at the outputs of Exclusive-OR gates 22 and 23 are arithmetically summed at junction A. Resistors 24, 25, 26 and 27 are selected so that the junction A is normally maintained at a medium potential M at which clock pulses Pc and window pulses Pw are in exact phase.

Window pulses are supplied to one input of NAND gate 21 to be compared in phase with clock pulses from the oscillator 19. The phase difference between these pulses results in the generation of a negative-going pulse Pn whose leading edge is coincident with the leading edge of window pulse Pw and whose trailing edge is coincident with the trailing edge of clock pulse Pc, as shown in FIG. 2.

Exclusive-OR gate 22 provides a first, positive-going phase error pulse $Pe_1$ which is reverse in polarity to the input pulse Pn. Exclusive-OR gate 23 provides a second, negative-going phase error pulse $Pe_2$ whose leading edge is coincident with the trailing edge of clock pulse Pc and whose trailing edge is coincident with the trailing edge of window pulse Pw. The durations of phase error pulses $Pe_1$ and $Pe_2$ thus vary complementarily with each other according to the amount of phase difference between pulses Pw and Pc. The positive-going pulse $Pe_1$ and negative-going pulse $Pe_2$ are combined at junction A so that the potential thereat is driven to a high voltage level H in the presence of the pulse $Pe_1$ and driven to a lower voltage level L in the presence of the pulse $Pe_2$ for complemental periods of time as shown at Pe in FIG. 2 on detection of a phase difference.

Noise suppressor 16 is formed by a pair of antiparallel-connected diodes 28 and 29. The phase error voltage having amplitudes greater than the thresholds of diodes 28 and 29 are passed to the inverting input of operational amplifier 30. Small amplitude noise components which might be present in the phase error voltage at junction A are therefore blocked.

A series circuit of integrating resistor 31 and capacitor 32 is connected between the output of amplifier 30 and the inverting input thereof to permit operational amplifier 30 to provide detection of a difference potential between the voltage applied to the inverting input and a reference voltage applied to its noninverting input and provide integration of the difference potential. Operational amplifier 30 drives the oscillator 19 to control its frequency and phase to maintain clock and window pulses in proper phase relationship.

The loop gain of the phase-locked loop 10 is determined by the reference voltage developed by phase reference circuit 15. This circuit comprises a pair of Exclusive-OR gates 33 and 34 and a resistor network formed by a first series of resistors 35 and 36 and a second series of resistors 37 and 38, both being connected across the outputs of Exclusive-OR gates 33 and 34. First input terminals of Exclusive-OR gates 33 and 34 are coupled together to the input terminal 20 and their second inputs are connected respectively to high and low level voltages corresponding to binary "1" and "0", respectively. A junction between resistors 35 and 36 is connected to a high-level voltage source and a junction B between resistors 37 and 38 is connected to the noninverting input of operational amplifier 30. Resistors 37 and 38 combine to form an adder with which the output of Exclusive-OR gates 33 and 34 are arithmetically summed at junction B. Exclusive-OR gate 33 has the effect of generating a series of pulses having an opposite polarity to those applied to the input terminal 20 and Exclusive-OR gate 34 has the effect of generating a series of pulses which is the replica of the input EFM bit stream. Therefore, the output pulses from Exclusive-OR gates 33 and 34 are opposite in polarity to each other and canceled at junction B. Resistors 35, 36, 37 and 38 determine the reference voltage at junction B and hence the loop gain. The application of EFM input bit stream to Exclusive-OR gates 33 and 34 causes the reference voltage to vary simultaneously with the occurrence of a phase error voltage. This improves the transient response of the phase-locked loop. The input signal to Exclusive-OR gates 33 and 34 may alternatively be taken from the output of NAND gate 21 as indicated by a broken-line 39. Since the reference circuit is indentical in configuration to a portion of the phase comparator 14, the reference voltage varies with the output of phase comparator 14 under varying temperature and humidity conditions.

In this way, the voltage-controlled oscillator 19 is controlled by the time-integral value of the difference between voltage inputs to operational amplifier 30. The output of voltage-controlled oscillator 19 is connected to an output terminal 70 from which clock pulses are supplied to a digital demodulator, not shown.

When the clock pulse deviates from normal frequency, the phase-locked loop 10 receives a frequency control signal from the frequency comparator 12 through terminal 41.

Referring to FIG. 1B, frequency comparator 12 includes frequency detectors 42a and 42b each comprising a counter 43, latch 44 and a reference frequency oscillator 45. Oscillator 45a of the frequency detector 42a generates a frequency lower than the frequency generated by the oscillator 45b of frequency detector 42b. Both reference frequencies are much lower than the normal frequency of the voltage-controlled oscillator 19 to enable counters 43a and 43b- to detect instantaneous values of the clock frequency with low and high speeds, respectively. More specifically, low-frequency oscillator 45a resets the counter 43a and latch 44a at longer intervals to enable the counter 43a to count the clock pulses during such intervals and store the count in latch 44a as a long-term measurement of the instantaneous clock frequency. Likewise, high-frequency oscillator 45b resets counter 43b and latch 44b at shorter intervals to enable the counter 43b to count the clock pulses during such intervals and store the count in latch 44b as a short-term measurement of the instantaneous clock frequency. Thus, when there is a variation in clock frequency the pulse count in latch 44b varies more quickly than does the count stored in latch 44a.

The output of latch 44a is applied to narrow-range digital comparators 46 and 47 and the output of latch 44b to wide-range digital comparators 48 and 49. Comparators 46 and 47 compare the output of latch 44a with digital values Ln and Un which respectively correspond to the lower and upper limits of a predetermined narrow range of clock frequency variations typically +1 percent of the normal clock frequency. On the other hand, comparators 48 and 49 compare the output of latch 44b with digital values Lw and Uw which correspond respectively to the lower and upper limits of a wide range of clock frequency variations typically +5 percent of the normal clock frequency. Comparator 46 generates a high level output when the clock frequency reduces below the lower limit of the narrow range and comparator 47 generates a high level output when it rises above the upper limit of the narrow range. Therefore, when the clock frequency is within the narrow range, the outputs of comparators 46 and 47 are at low voltage levels. Likewise, comparator 48 generates a high level output when the clock frequency reduces below the lower limit of the wide range and comparator 49 and comparator 49 generates a high level output when it goes beyond the upper limit of the wide range. Thus, the outputs of comparators 48 and 49 remains low when the clock frequency is within the wide range.

The outputs of comparators 46 and 47 are normally connected respectively through contacts "a" of switches 52 and 53 to first inputs of OR gates 50 and 51 and the outputs of comparators 48 and 49 are connected respectively to second inputs of the OR and OR gates. When switched to positions "b", switches 52 and 53 couple a low-level voltage through resistor 54 to the first inputs of OR gates 50 and 51 to disable the outputs of comparators 46 and 47.

The output of OR gate 50 is inverted by an inverter 61 and combined with the output of OR gate 51 in a summing resistor network 55 formed by resistors 56 and 57 which couple the outputs of inverter 61 and OR gate 51 together to a high-level voltage terminal 60 and resistors 58 and 59 coupling them to the terminal 41.

Figure 3:
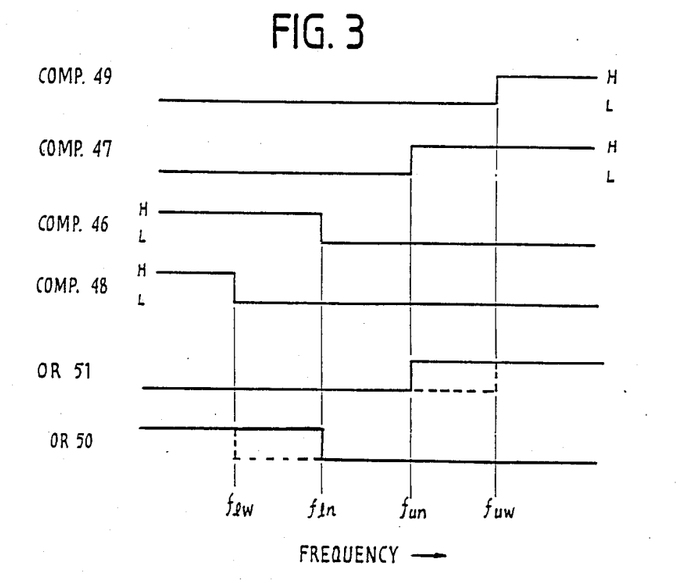
FIG. 3 is a waveform diagram useful for describing the operation of the frequency comparators of FIGS. 1B and 1C.

The operation of the circuit of FIG. 1B will be better understood with reference to waveforms shown in FIG. 3. Switches 52 and 53 are in contact position "a" when the incoming bit stream has the normal frequency and may either be a continuous or discontinuous nature.

Assume that the incoming bit stream is of a continuous nature. If the clock frequency of the oscillator 19 is within the narrow capture range defined between lower and upper frequency limits $f_{ln}$ and $f_{un}$, the outputs of all the comparators are at low voltage level and OR gates 50 and 51 develop low-voltage outputs. The low output voltage of OR gate 50 is inverted to a high voltage by inverter 61 and combined with the low voltage output of OR gate 51 in the resistor summing network 55 to produce a medium-voltage frequency control signal at terminal 41, which is applied through noise suppressor 17 to the inverting input of operational amplifier 30 so that it drives the oscillator 19 to tune to the clock timing of the incoming bit stream. Noise suppressor 17 is formed by a pair of antiparallel-connected diodes 67 and 68 to suppress small-amplitude noise contained in the frequency control signal.

If the clock frequency goes beyond the upper frequency $f_{un}$ of the narrow range, the output of comparator 47 switches to a high voltage level and the outputs of the other comparators remain at low voltage level. Thus, the input voltages of the summing network 55 are both high, producing a high-voltage frequency control signal at terminal 41 which causes the oscillator 19 to reduce its frequency until it enters the narrow capture range.

If the clock frequency drops below the lower frequency $f_{ln}$ of the narrow range, comparator 46 produces a high-level output while the other comparators produce low-voltage outputs. The input voltages of summing network 55 are both low, producing a low-voltage frequency control signal at terminal 41 which causes the oscillator 19 to raise its frequency until it enters the narrow capture range. Since the input signals of comparators 46 and 47 are derived from long-term measurement of the oscillator clock frequency, insignificant variations of clock frequency, which would otherwise cause system instability, can be absorbed.

Assume that the incoming bit stream is substantially of a discontinuous nature. It is likely that the clock frequency instantly goes out of the wide range, causing one of the comparators 48 and 49 to produce a high voltage level depending on which direction the clock frequency. Because of the quicker response characteristic of the frequency detector 42b than that of the frequency detector 42a, the frequency control signal from either comparator 48 or 49 is produced at a point in time earlier than the time at which the long-term frequency detector 42b causes comparators 46 and 47 to generate a frequency control signal. Thus, if the clock frequency goes higher than the upper limit $f_{uw}$ of the wide range, the input voltages of summing network 55 are quickly brought to high level to reduce the clock frequency, and if it goes lower than the lower limit $f_{lw}$ of the wide range, the input voltages of the summing network are quickly brought to low level, causing the clock frequency to increase.

In this way, the clock frequency of the oscillator 19 is quickly pulled back into the wide range during the reception of a discontinuous incoming bit stream. Once the clock frequency enters the wide range limits, the clock frequency stabilizes and approaches the normal value and the long-term frequency detector 42a plays a dominant role in fine-tuning the clock frequency into the narrow range.

Switches 52 and 53 are transferred to the position "b" when the incoming bit stream is at a higher-than-normal frequency as during a high-speed program search mode. The outputs of narrow-range comparators 46 and 47 are disconnected and instead a low voltage is applied to OR gates 50 and 51. Thus, the narrow range frequency control is disabled. Due to the higher-than-normal frequency, the clock frequency tends to quickly go out of the wide range. The short-term frequency detector 42b quickly detects such deviation causes one of the wide-range comparators 48 and 49 to generate an appropriate control signal depending on the direction of the deviation. The disablement of the narrow-range comparators 46, 47 is to prevent the narrow range control from interfering with the wide range control.

Figure 1C:
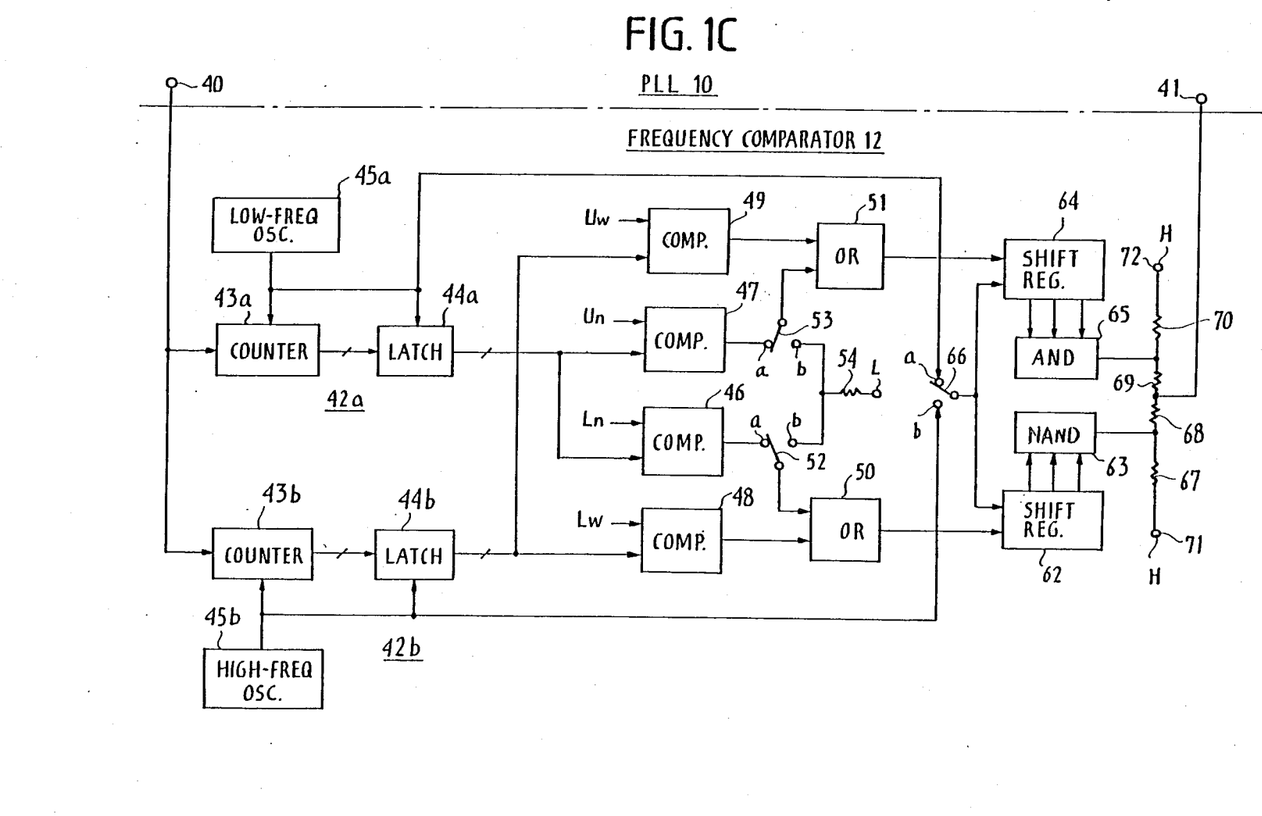
FIG. 1C is an illustration of a modified form of the frequency comparator.

It is preferable in some instances to introduce delays to the frequency control signal to stabilize the phase-locked loop against rapid fluctuations in frequency. To meet this purpose a modification is shown in FIG. 1C in which parts corresponding to those in FIG. 1B are marked with the same numerals as used in FIG. 1B.

In this modification, the output of OR gate 50 is applied to the data input of a three-stage shift register 62 and the output of OR gate 51 is applied to the data input of a three-stage shift register 64. A switch 66 is ganged of switches 52 and 53. With switch 66 being in position "a" for normal tape speed operations, the low-frequency oscillator 45a is connected to the shift terminals of shift registers 62 and 64. When switched to position "b" for high speed tape operations, the shift pulse is applied from the high-frequency oscillator 45b. The outputs of shift register 62 are coupled to a NAND gate 63 and those of shift register 64 to an AND gate 65. The output of NAND gate 63 is connected to a junction between resistors 67 and 68 and the output of AND gate 65 is connected to a junction between resistors 69 and 70 which are connected in series with resistors 67 and 68 between high-voltage terminals 71 and 72, a junction between resistors 68 and 69 being connected to terminal 41.

Assume that the clock generator is operated with switches 52, 53 and 66 in their "a" position. If the clock frequency lies within the narrow capture range, the outputs of OR gates 50 and 51 are low and therefore the outputs of NAND gate 63 and AND gate 65 are high and low, respectively. These voltages are combined at terminal 41 to produce a medium-voltage frequency control signal. If the clock frequency becomes higher than the upper limit of the narrow range, the output of OR gate 51 swithces to a high voltage. If this condition continues for a period of three consecutive shift pulses at the low reference frequency, the output of AND gate 65 switches to high level. Since the output of NAND gate 63 is high, the frequency control signal rises above the medium frequency-control voltage to reduce the oscillator frequency until it enters the narrow capture range. If the clock frequency becomes lower than the lower limit of the narrow range, the output of OR gate 50 switches to a high voltage level. If this condition exists for a period of three consecutive low-frequency shift pulses, the output of NAND gate 63 switches to low level. Since the output of OR gate 51 and hence the output of AND gate 65 is low, the frequency control signal reduces below the medium frequency-control voltage to raise the clock frequency until it returns to the nominal frequency.

The operation of shift registers 62 and 64 is similar to that described above when the clock frequency goes beyond the wide range provided that switches 52, 53 and 66 are in the "a" position.

With switch 66 being turned to the "b" position together with switches 52 and 53 for high tape speed operations, the shift registers 62 and 64 are shifted at the higher frequency, so that the amounts of delay introduced upon the exceedance of the wide range are reduced for quick recovery.

Figure 4A:
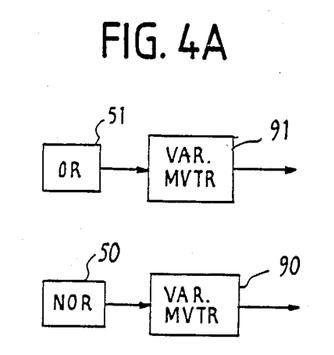
FIGS. 4A, 4B and 4C are illustrations of modified embodiments of the invention.
Figure 4B:
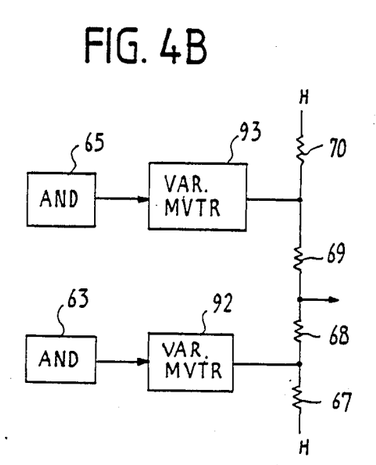
Figure 4C:
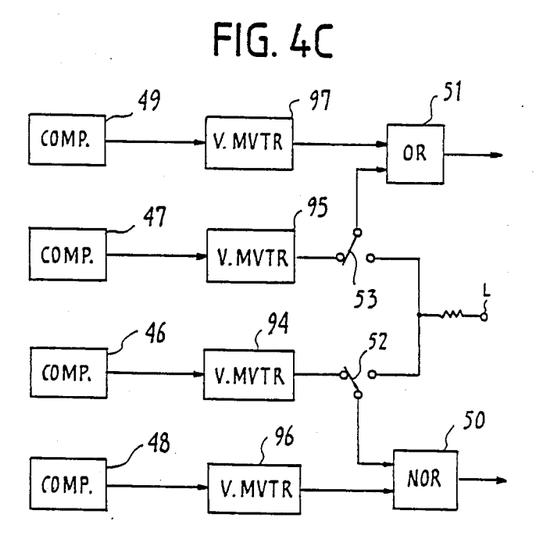

FIGS. 4A, 4B and 4C are illustrations of modified embodiments in which variable monostable multivibrators are employed to control the gain of the closed phase-and-frequency control loop. The variable monostable multivibrators used in these embodiments produce frequency control pulses with durations determined by adjusting the periods of the multivibrators to give an appropriate duty ratio. In FIG. 4A, variable monostable multivibrators 90 and 91 are connected respectively to the outputs of NOR gate 50 and OR gate 51, and in FIG. 4B variable monostable multivibrators 92 and 93 are connected respectively to the outputs of AND gate 63 and 65. In FIG. 4C, variable monostable multivibrators 94 and 95 are connected to the outputs of narrow range comparators 46 and 47, respectively, and variable monostable multivibrators 96 and 97 are connected to the outputs of wide range comparators 48 and 49, respectively.

Figure 5:
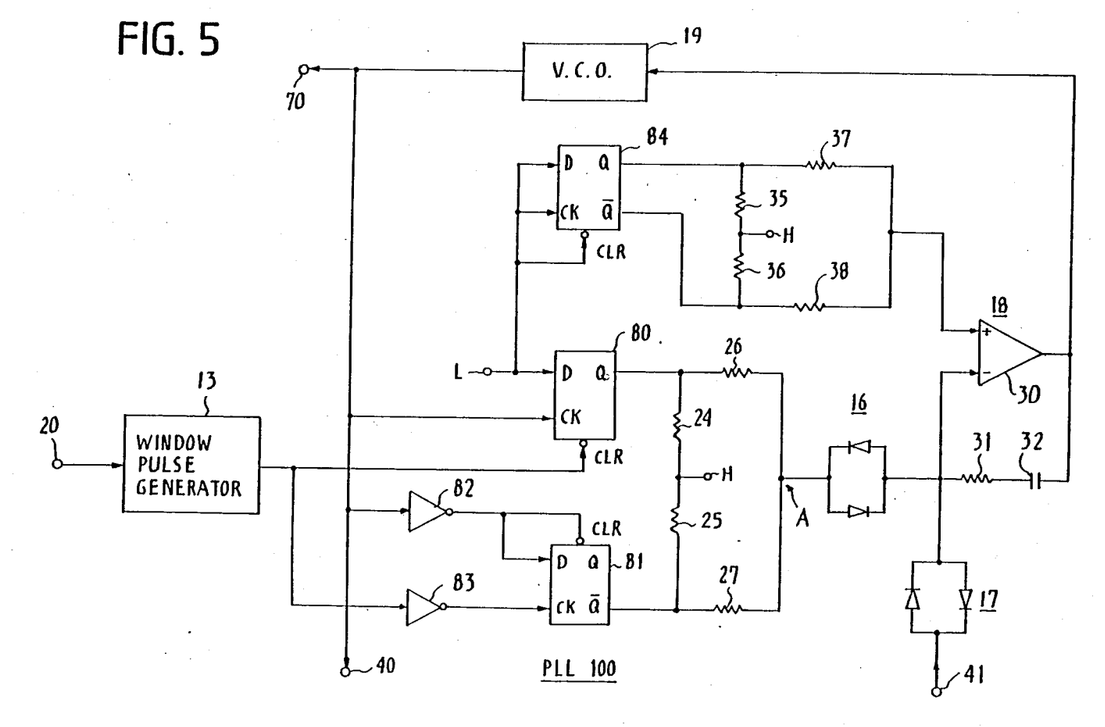
FIG. 5 is a block diagram of a modified phase-locked loop of the invention.

FIG. 5 is an illustration of an alternative embodiment of the phase-locked loop which is generally shown at numeral 100 and in which parts corresponding to those in FIG. 1A are marked with the same numerals as used in FIG. 1A. The phase-locked loop 100 differs from the phase-locked loop 10 in that D flip-flops 80, 81, 84 and inverters 82 and 83 replace the Exclusive-OR gates 22, 23, 33, 34 and NAND gate 21 of FIG. 1A. The output of window pulse generator 13 is applied to the clear input of flip-flop 80 and through inverter 83 to the clock input of flip-flop 81. Whereas, the output of voltage-controlled oscillator 19 is connected to the clock input of flip-flop 80 whose data input is impressed with a logical low voltage and through inverter 82 to the data and clear terminals of flip-flop 81. The true Q output of flip-flop 80 and the complementary Q output of flip-flop 81 are connected to the resistor network formed by resistors 24 to 27. Flip-flop 84 has its data, clock and clear input terminals coupled together to the logical low voltage source and its true and complementary Q outputs connected to resistors 35 to 38.

Figure 6A:
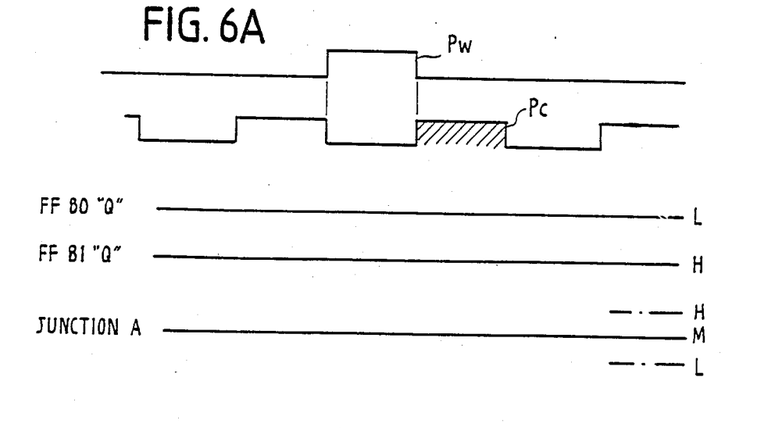
FIGS. 6A to 6C are waveform diagrams associated with the embodiment of FIG. 5.
Figure 6B:
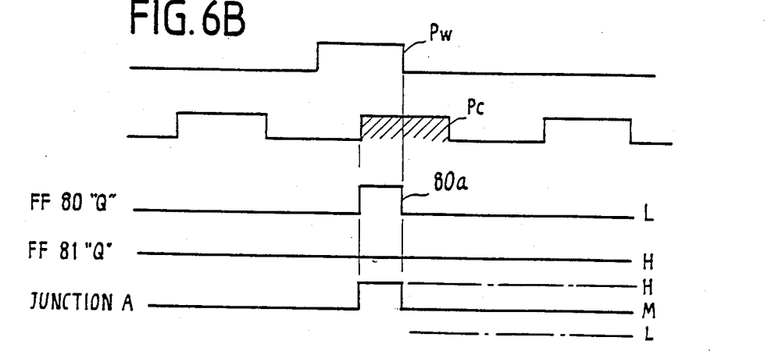
Figure 6C:
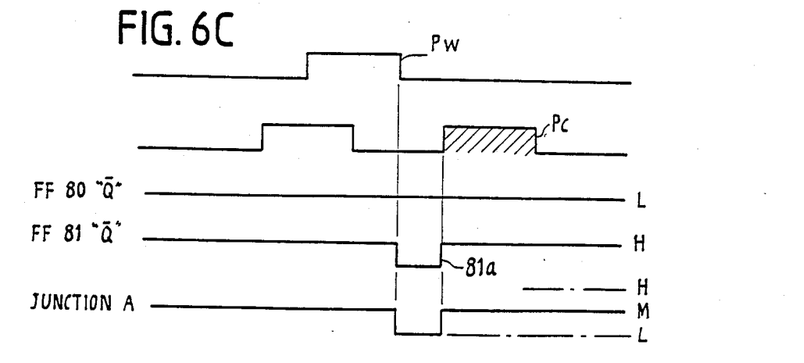

The operation of the phase-locked loop 100 is as follows. When clock pulses Pc are phase-locked with window pulses Pw as shown at FIG. 6A, the voltages at the outputs of flip-flops 80 and 81 are low and high, respectively, which are combined to produce a medium voltage M at junction A. When the clock pulse advances with respect to the window pulse, flip-flop 80 produces a positive-going pulse 80a (FIG. 6B) having a leading edge coincident with the leading edge of a clock pulse and a trailing edge coincident with the trailing edge of the window pulse, while the output of flip-flop 81 remains high. The positive-going pulse 80a is combined with the high voltage at the output of flip-flop 81 to cause the potential at junction A to rise to a level higher than medium level M during the period of pulse 80a to cause the oscillator 19 to lag the phase of the clock pulse in proportion to the amount of phase advance. If the clock pulse lags with respect to the window pulse, flip-flop 80 remains at low voltage state while flip-flop 81 generates a negative-going pulse 81a, as shown at FIG. 6C. This pulse has a leading edge coincident with the trailing edge of window pulse Pw and a trailing edge coincident with the leading edge of clock pulse Pc. The potential at junction A is reduced to a level lower than the medium level during the period of the pulse 81a to cause the oscillator 19 to advance the clock phase in proportion to the amount of phase lag.

The embodiments described above are particularly advantageous for adaptation to integrated circuit technology.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A clock generator adapted to receive a digital bit stream, comprising:
    a voltage-controlled oscillator for generating clock pulses having a frequency and a phase which are variable in response to an input signal applied thereto;
    means for generating a window pulse in response to a predetermined transition between binary "1"s and binary "0"s in said bit stream;
    a phase comparator responsive to said window and clock pulses for generating a phase control signal representing the difference in phase between said window pulse and said clock pulse;
    first frequency detector means for counting said clock pulse at longer periodic intervals to generate a first count representing a long-term measurement of the instantaneous frequency of said clock pulse;
    second frequency detector means for counting said clock pulse at shorter periodic intervals to generate a second count representing a short-term measurement of the instantaneous frequency of said clock pulse;
    comparator means for detecting whether said first count is below a lower limit of a narrow range or above an upper limit of the narrow range and producing a first frequency control signal of different amplitudes depending on the relative value of said first count to said lower and upper limits of the narrow range and for detecting whether said second count is below a lower limit of a wide range or above an upper limit of the wide range and producing a second frequency control signal of different amplitudes depending on the relative value of said second count to the upper and lower limits of said wide range; and
    means for combining said first and second frequency control signals with said phase control signal and applying the combined signals to said voltage-controlled oscillator as said input signal.

2. A clock generator as claimed in claim 1, further comprising means for disabling said first frequency control signal when said bit stream has bits occurring at a frequency higher than a normal frequency of the bit stream.

3. A clock generator as claimed in claim 1, wherein said comparator means comprises;
    a first comparator circuit for comparing said first count with said lower and upper limits of said narrow range and producing a first comparator output when said first count is smaller than said narrow range lower limit and a second comparator output when said first count is higher than said narrow range upper limit;
    a second comparator circuit for comparing said second count with said lower and upper limits of said wide range and producing a third comparator output when said second count is smaller than said wide range lower limit and a fourth comparator output when said second count is higher than said wide range upper limit; and
    a summing network for summing said first and second comparator outputs to produce said first frequency control signal and summing said third and fourth comparator outputs to produce said second frequency control signal.

4. A clock generator as claimed in claim 1, wherein said comparator means comprises;
    a first comparator circuit for comparing said first count with said lower and upper limits of said narrow range and producing a first comparator output when said first count is smaller than said narrow range lower limit and a second comparator output when said first count is higher than said narrow range upper limit;
    a second comparator circuit for comparing said second count with said lower and upper limits of said wide range and producing a third comparator output when said second count is smaller than said wide range lower limit and a fourth comparator output when said second count is higher than said wide range upper limit;
    a first shift register responsive to said first and third comparator outputs;
    a second shift register responsive to said second and fourth comparator outputs;
    means for causing said first and second shift registers to shift their contents at periodic intervals;
    a first coincidence gate coupled to the outputs of said first shift register;
    a second coincidence gate coupled to the outputs of said second shift register; and
    a summing resistor network for summing output signals from said first and second coincidence gates to produce said first and second frequency control signals.

5. A clock generator as claimed in claim 4, wherein said first coincidence gate comprises an AND gate and said second coincidence gate comprises a NAND gate.

6. A clock generator as claimed in claim 1, wherein said window pulse has a pulse duration smaller than the pulse spacing of said clock pulses.

7. A clock generator as claimed in claim 1, wherein said combining means comprises an integrator for providing an integrated output to said voltage-controlled oscillator, and wherein said phase comparator comprises means for generating a first pulse having a duration variable as a function of the difference between a predetermined edge of said clock pulse and a leading edge of said window pulse and a second pulse having a duration variable as a function of the difference between said predetermined edge and a trailing edge of said window pulse and applying said first and second pulses to said integrator.

8. A clock generator as claimed in claim 7, wherein said integrator comprises a differential integrator having first and second input terminals, and wherein said phase comparator comprises:
a coincidence gate responsive to said window and clock pulses for generating a coincidence pulse with a duration representative of the difference in phase between said window and clock pulses;
a pair of first and second Exclusive-OR gates each having first and second input terminals, the first input terminals of the Exclusive-OR gates being coupled together to be responsive to said coincidence pulse, the second input terminal of said first Exclusive-OR gate being responsive to said window pulse and the second input terminal of said second Exclusive-OR gate being at a predetermined potential; and
a first voltage dividing resistor network for combining output signals from said first and second Exclusive-OR gates and applying the combined output signals to said first input terminal of the differential integrator,
further comprising a reference voltage generator which comprises:
a pair of third and fourth Exclusive-OR gates each having first and second input terminals;
means for applying predetermined potentials to said first and second input terminals of the third and fourth Exclusive-OR gates so that the third and fourth Exclusive-OR gates generate voltages of opposite polarity; and
a second voltage dividing resistor network identical in configuration to the first resistor network for combining said opposite polarity voltages and applying the combined voltages to said second input terminal of the differential integrator.

9. A clock generator as claimed in claim 8, wherein said potential applying means comprises means for applying said bit stream to the first input terminals of said third and fourth Exclusive-OR gates.

10. A clock generator as claimed in claim 9, wherein said potential applying means comprises means for applying said coincidence pulse to the first input terminals of said third and fourth Exclusive-OR gates.

11. A clock generator as claimed in claim 1, wherein said signal combining means comprises an integrator for providing an integrated output to said voltage-controlled oscillator, and wherein said phase comparator comprises means for generating a first pulse having a duration variable as a function of the difference between a predetermined edge of said clock pulse and a predetermined edge of said window pulse when said clock pulse is advanced with respect to said window pulse and a second pulse having a duration variable as a function of the difference between said predetermined edges of said clock and window pulses when said clock pulse lags with respect to said window pulse and applying said first and second pulses to said integrator.

12. A clock generator as claimed in claim 11, wherein said integrator comprises a differential integrator having first and second input terminals, and wherein said phase comparator comprises:
a pair of first and second D flip-flops;
means for applying said window and clock pulses to said first and second D flip-flops to generate said first and second pulses at the outputs of the first and second D flip-flops;
a first voltage dividing resistor network for combining output signals from said first and second D flip-flops and applying the combined output signals to said first input terminal of the differential integrator,
further comprising a reference voltage generator which comprises:
a third D flip-flop;
means for applying predetermined potentials to said third D flip-flop to cause it to generate voltages of opposite polarity; and
a second voltage dividing resistor network identical in configuration to the first resistor network for combining said opposite polarity voltages and applying the combined voltages to said second input terminal of the differential integrator.

13. A clock generator as claimed in claim 1, wherein said comparator means comprises variable monostable multivibrators for converting said first and second frequency control signals into respective pulse signals.

* * * * *